United States Patent [19]

Hattori

[11] Patent Number: 4,628,484

[45] Date of Patent: Dec. 9, 1986

[54] SIGNAL AND POWER APPLYING UNIT FOR MEMORY CASSETTES

[75] Inventor: Seiichi Hattori, Tokyo, Japan

[73] Assignee: Fanuc Ltd, Minamitsuru, Japan

[21] Appl. No.: 757,207

[22] Filed: Jul. 22, 1985

Related U.S. Application Data

[63] Continuation of Ser. No. 452,140, Dec. 22, 1982, abandoned.

[30] Foreign Application Priority Data

Dec. 29, 1981 [JP] Japan ............... 56-213941

[51] Int. Cl.⁴ .................. G11C 5/04; G11C 11/34
[52] U.S. Cl. .................... 365/52; 365/228
[58] Field of Search .................. 365/1, 52, 228

[56] References Cited

U.S. PATENT DOCUMENTS 4,109,161  8/1978  Iijima .
4,228,536 10/1980  Gueldenpfennig et al. ........ 370/66
4,400,795  8/1983  Irie et al. ..................... 365/1
4,459,679  7/1984  Sukeda et al. .................. 365/1

FOREIGN PATENT DOCUMENTS 0027337  4/1981  .

OTHER PUBLICATIONS

English Abstract of Japanese Patent A-55-62589.
Patents Abstracts of Japan, vol. 5, No. 182 (p. 90), (854) Nov. 20, 1981 & JP-A-56 111196 (Yokogawa Denki Seisakusho K.K.) 09-02-81.
Patents Abstracts of Japan, vol. 4, No. 103 (p. 20), (585) July 23, 1980 & JP-A-55 62589 (Matsushita Kenki Sangyo K.K.) 05-12-80.

Primary Examiner—James W. Moffitt
Attorney, Agent, or Firm—Staas & Halsey

[57] ABSTRACT

When a memory cassette having semiconductor memory is attached to or detached from a connector mounted on an adapter, the supply of power to the memory cassette through the adapter is switched on or off and an interface signal between the memory cassette and the adapter is rendered active or inactive in response to connection or disconnection between the memory cassette and the adapter. The stored content of the semiconductor memory can be protected against destruction which would otherwise result from application of a power supply voltage upon connection or disconnection between the memory cassette and the adapter.

5 Claims, 2 Drawing Figures

SIGNAL AND POWER APPLYING UNIT FOR MEMORY CASSETTES

This is a Continuation of Ser. No. 452,140, filed on Dec. 22, 1983, now abandoned.

BACKGROUND OF THE INVENTION

The present invention relates to a signal and power applying unit for use with a memory cassette containing therein a semiconductor memory and removably attached to an adapter mounted on the body of a numerically controlled machine tool.

Memory cassettes with semiconductor memories incorporated therein have recently been put to use as an external memory for storing a program and its data, and have come to see as wide an application as magnetic tape cassettes. The memory cassette is advantageous in that data does not need to be modulated and demodulated when written into or read out of the memory cassette, and no drive mechanism is required. Therefore, the stored data in the memory cassette is highly reliable, the memory cassette is small in size and is less likely to fail during operation.

The memory cassette is connected by connectors to an adapter mounted on a numerically controlled machine. A program and its data stored in the memory cassette can be loaded into a memory in the numerically controlled machine through the adapter under the control of a read command issued by the numerically controlled machine. Usually, the memory cassette has no power supply of its own for energization, but is supplied with electric power through the adapter from the numerically controlled machine. The adapter and the memory cassette are mechanically coupled for electric connection by the connector, which comprises male and female interfitting connector members. Since the male and female members are normally manually coupled or disengaged, contact pins of the male member are brought into and out of contact with the receptacles of the female member at different times. Prior to connection of the memory cassette, the power supply on the adapter connector member has already been switched on with a voltage applied to the contact pins on the adapter connector member, and an interface signal between the memory cassette and the adapter has been in an active state. When the memory cassette is to be connected to the adapter, connection of the contact pins at varying timing can apply the power supply voltage through a bypass or leakage route to the semiconductor memory, which is then can be destroyed. More specifically, the voltage may be applied to the semiconductor memory through a contact pin at the instant a contact pin leading to a 5-V power supply is connected while a ground pin is not yet connected. This applied voltage accidentally erases a stored program, or destroys the semiconductor memory.

SUMMARY OF THE INVENTION

It is an object of the present invention to provide a signal and power applying unit for memory cassettes which protects the stored content of a semiconductor memory of the memory cassette against accidental erasure when the memory cassette is attached to or detached from an adapter.

Another object of the present invention is to provide a signal and power applying unit for memory cassettes which protects the stored content of a semiconductor memory of the memory cassette against accidental erasure when the memory cassette is attached to or detached from an adapter, irrespective of connection or disconnection of a plurality of pins at different times.

Still another object of the present invention is to provide a signal and power applying unit for memory cassettes which prevents a power supply voltage from an adapter from being applied to a semiconductor memory of the memory casstte through a bypass or leakage route to thereby protect the stored content of the semiconductor memory against accidental destruction when the memory cassette is attached to or detached from a connector of the adapter.

The above objects can be achieved by providing a control circuit for switching off the supply of power to a memory cassette through an adapter and for rendering an interface signal inactive between the memory cassette and the adapter when the memory cassette is disconnected from the adapter. The control circuit is responsive to an operation permit signal delivered from a connection detecting circuit to detect connection between the memory cassette and the adapter and switches on or off application of a power supply voltage and renders the interface signal active or inactive. When the memory cassette is connected, a connection signal is fed to the connection detecting circuit to allow the operation permit signal to go high, whereupon the control circuit applies the power supply voltage to the memory cassette and activates interface signal. When the memory cassette is pulled out of the adapter, the operation permit signal is rendered inactive by a withdrawal signal produced on the pullout of the memory cassette, enabling the control circuit to switch off the power supply voltage and make the interface signal inactive. With the arrangement of the present invention, a plurality of contact pins on connectors of the memory cassette and the adapter are connected or disengaged only when the power supply voltage is not applied and the interface signal is inactive. There is no danger of the power supply voltage being applied through a bypass or leakage route to a semiconductor memory in the memory cassette when the latter is connected or disconnected, thus protecting the stored content of the semiconductor memory against accidental erasure or destruction.

The above and other objects, features and advantages of the present invention will become more apparent from the following description when taken in conjunction with the accompanying drawings in which a preferred embodiment of the present invention is shown by way of illustrative example.

DESCRIPTION OF THE PREFERRED EMBODIMENT

Figure 1:
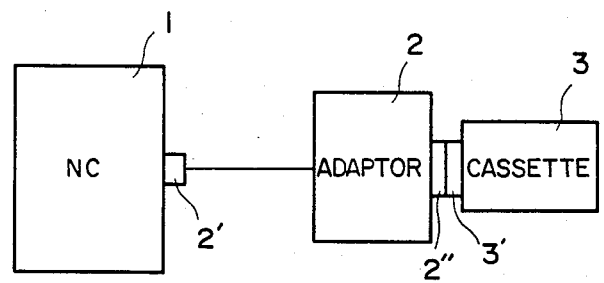
FIG. 1 is a schematic diagram of a memory cassette connected by an adapter to a numerically controlled machine.

As shown in FIG. 1, an adapter 2 is connected by a connector 2' to an apparatus 1 such as a numerically controlled machine, the adapter 2 having a connector 2". A memory cassette 3 is connected to the adapter connector 2" by a connector 3'. A program and data stored in the memory cassette 3 are loaded in a memory in the apparatus 1 through the adapter 2 under a read control command delivered from the apparatus 1 via the adapter 2. The apparatus 1 will then execute a sequence of desired processing operations under the control of the loaded program and data. When necessary, the program and data can be read out of the apparatus 1 into the memory cassette 3 through the adapter 2.

Figure 2:
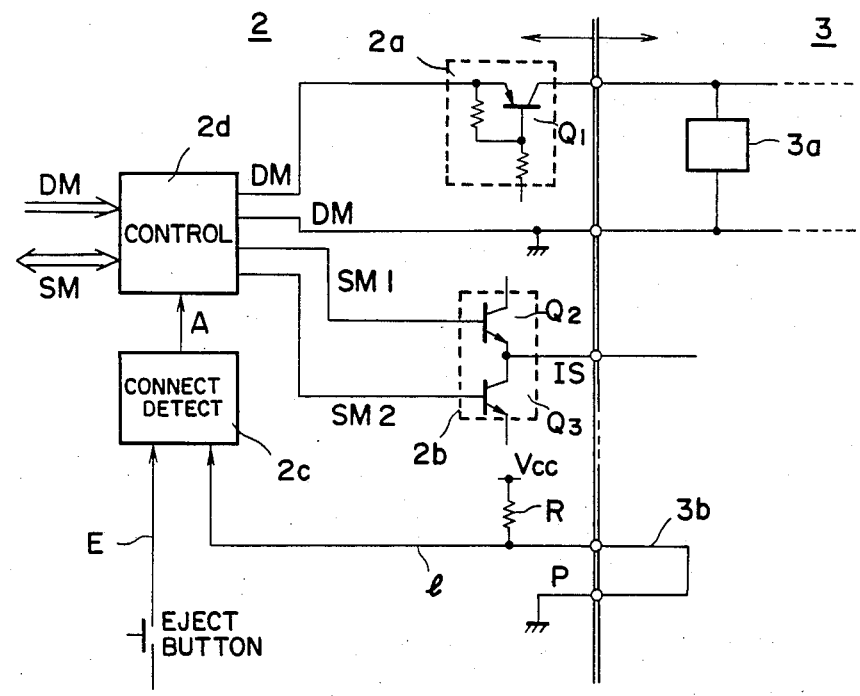
FIG. 2 is a block diagram of a signal and power applying unit according to the present invention.

In FIG. 2, the adapter 2 and the memory cassette 3 are interconnected by the connectors 2", 3' as illustrated in FIG. 1, through contact pins of the connectors 2", 3', the contact pins being denoted in FIG. 2 as small circles or dots.

The adapter 2 includes a driver circuit 2a for supplying a power supply voltage (+5 V, for example), the driver circuit 2a comprising of a transistor $Q_1$ for applying the power supply voltage to a contact pin of the connector 2". The adapter 2 also has a signal driver circuit 2b for transmitting and receiving signals, the signal driver circuit 2b having a pair of transistors $Q_2$, $Q_3$. When any one of the transistors $Q_2$, $Q_3$ is turned on, the signal driver circuit 2b can send or receive an interface signal IS. A cassette connection detecting circuit 2c can be set by a connection signal P on a line 1 which is grounded through a detection loop 3b in the memory cassette 3 when the memory cassette 3 is connected to the adapter 2. The cassette connection detecting circuit 2c can be reset by a pullout signal E produced in response to actuation of an eject button (not shown) prior to withdrawal of the memory cassette 3 from the adapter 2. The cassette connection detecting circuit 2c, which can be an S/R flip-flop, can feed a control circuit 2d (later described) with an operation permit signal A having a high logic level in synchronism with the connection signal P and a low logic level in synchronism with the withdrawal signal E. The control circuit 2d is supplied with a voltage DM from a power supply in the apparatus 1 or a power supply contained in the control circuit 2d itself so that the control circuit 2d can be energized. The control circuit 2d applies the voltage DM to the driver circuit 2a for energizing the memory cassette 3, sends and receives a signal SM to and from the apparatus 1, and controls the signal driver circuit 2b for transmitting the interface signal IS to and receiving the interface signal IS from the memory cassette 3.

The control circuit 2d is responsive to the operation permit signal A which is at a high level (while the memory cassette 3 remains connected) for energizing the transistor $Q_1$ of the driver circuit 2a to supply the voltage DM to the memory cassette 3 and at the same time for energizing either one of the transistors $Q_2$, $Q_3$ to render the interface signal IS active. While the operation permit signal A is at a low state, that is, while the memory cassette 3 is being disconnected, the control circuit 2d de-energizes the transistor $Q_1$ of the driver circuit 2a to prevent the voltage DM from being applied to the memory cassette 3 and simultaneously de-energizes both the transistors $Q_2$, $Q_3$ of the signal driver circuit 2b to allow the signal driver circuit 2b to have a high impedance.

The memory cassette 3 has a semiconductor memory 3a in the form of an EEPROM (electrically erasable programmable read only memory) or the like, which is supplied with the power supply voltage through the driver circuit 2a and the connectors 2", 3'. The memory cassette 3 is composed of a plurality of such semiconductor memories. The connection detecting loop 3b is contained in the memory cassette 3 and allows the line 1 of the adapter 2 to be connected to a ground line through a contact pin when the memory cassette 3 is coupled to the adapter 2 via the connectors 2", 3'. Since the line 1 is connected through a resistor R to a power supply Vcc, the line 1 produces the connection signal P when grounded.

Operation of the signal and power supply unit constructed as shown in FIG. 2 is as follows. While the memory cassette 3 is completely disconnected from the adapter 2, the voltage is applied through the resistor R to the line 1, with no connection signal P generated, the connection detecting circuit 2c remains rest, and no operation permit signal A is produced. The control circuit 2d renders the transistor $Q_1$ of the driver circuit 2b nonconductive to supply no power supply voltage. At the same time, the control circuit 2d turns off the transistors $Q_2$, $Q_3$ of the signal driver circuit 2b, with the result that the signal driver circuit 2b is in a high-impedance state. Before the memory cassette 3 is connected to the adapter 2, therefore, no power supply voltage is applied to a power supply contact pin of the connector 2" of the adapter 2, and the interface signal IS at an interface contact pin is rendered inactive by the high impedance of the signal driver circuit 2b. When the memory cassette 3 is connected to the adapter 2 through the connectors 2", 3' with the pins of the detection loop 3b connected to the connector 2" of the adapter 2, the connection signal P which is of the ground potential is produced over the line 1, setting the connection detecting circuit 2c. Therefore, the operation permit signal A is generated or goes high, allowing the control circuit 2d to turn on the transistor Q1 of the driver circuit 2a to apply the power supply voltage DM to the power supply pin of the connector 2". The memory cassette 3 is now supplied with the power supply voltage. The control circuit 2d also turns on either the transistor $Q_2$ or the transistor $Q_3$ to release the signal driver circuit 2b of the high impedance, thereby rendering the interface signal IS active. Now, signals can be sent to or received from the semiconductor memory 3a of the memory cassette 3.

The power supply voltage cannot be supplied and the interface signal is not activated unless the connector 2" of the adapter 2 and the connector 3' of the memory cassette 3 are fully coupled together. As a result, any adverse effects can be avoided which would otherwise be caused by an output from the driver circuits of the adapter 2 if the memory cassette 3 were not completely coupled to the adapter 2. To make such fail-safe operation more reliable, it is preferable that the operation permit signal A be generated a predetermined period of time after the connection signal P has been produced by providing the connection detecting circuit 2c with means having delay characteristics.

The signal and power applying unit according to the present invention also has provisions to cope with any adverse influence which could result from disconnection of the memory cassette 3 from the adapter 2. More specifically, manual pullout of the memory cassette 3 is preceded by depression of the eject button which may be a button for unlocking the memory cassette 3 which has been mechanically locked in the adapter 2 on connection thereto. When the eject button is depressed, a switch associated therewith is actuated to produce the withdrawal signal E, which resets the connection detecting circuit 2c causing the operation permit signal A to go low. Therefore, the control circuit 2d turns off the transistor $Q_1$, prevents the voltage DM from being applied, turns off the transistors $Q_2$, $Q_3$ to let the signal driver circuit 2b be in the high-impedance state. Then, the memory cassette 3 is pulled out of the adapter 2 without being adversely affected by the driver circuits of the adapter 2 which would otherwise produce harmful outputs upon pulling out the memory cassette 3.

Although a certain preferred embodiment has been shown and described in detail, it should be understood that many changes and modifications may be made therein without departing from the scope of the appended claims.

What I claim is:

1. A device for applying an interface signal and a power supply voltage to a semiconductor memory cassette through an adapter, comprising:
   first means for generating a connection signal when the memory cassette and the adapter are interconnected;
   second means, separate from said first means, for generating a withdrawal signal when the memory cassette is disconnected from the adapter;
   connection detecting means, operatively connectable to said first and connected to said second means and responsive to said connection and withdrawal signals, for producing first and second operation permit signals, respectively; and
   control means, operatively connected to said connection detection circuit and responsive to said first operation permit signal, for applying the power supply voltage to the memory cassette through the adapter and rendering the interface signal active, and also responsive to said second operation permit signal for switching off the power supply voltage and rendering the interface signal inactive, thereby preventing erasure in the semiconductor memory cassette.

2. A device according to claim 1, wherein said second means includes an eject button, operatively connected to said connection detecting means, actuatable to unlock the memory cassette mechanically from the adapter, said withdrawal signal being generated in response to actuation of said eject button.

3. A device according to claim 1, wherein said connection detecting means includes delay means for producing said first operation permit signal a predetermined period of time after said connection signal has been fed to said connection detecting circuit.

4. A device according to claim 1, wherein said first means includes a detection loop in the memory cassette, operatively connectable to said connection detecting means, for delivering said connection signal through said detection loop when the memory cassette is connected to the adapter.

5. A device according to claim 1, wherein said second means comprises a switch, operatively connected to said connection detection means, actuatable to generate said withdrawal signal before the memory cassette is disconnected from the adapter.

* * * * *